(12) United States Patent
Esquius Morote

(10) Patent No.: US 11,621,695 B2
(45) Date of Patent: Apr. 4, 2023

(54) CASCADED SURFACE ACOUSTIC WAVE DEVICES WITH APODIZED INTERDIGITAL TRANSDUCERS

(71) Applicant: RF360 EUROPE GMBH, Munich (DE)

(72) Inventor: Marc Esquius Morote, Munich (DE)

(73) Assignee: RF360 EUROPE GMBH, Munich (DE)

( * ) Notice: Subject to any disclaimer, the term of this patent is extended or adjusted under 35 U.S.C. 154(b) by 193 days.

(21) Appl. No.: 17/062,236

(22) Filed: Oct. 2, 2020

(65) Prior Publication Data
US 2022/0109419 A1    Apr. 7, 2022

(51) Int. Cl.
| | | |
|---|---|---|
| H03H 9/145 | (2006.01) |
| H03H 9/02 | (2006.01) |
| H03H 9/25 | (2006.01) |
| H03H 9/64 | (2006.01) |

(52) U.S. Cl.
CPC ...... *H03H 9/1452* (2013.01); *H03H 9/02685* (2013.01); *H03H 9/02818* (2013.01); *H03H 9/02834* (2013.01); *H03H 9/02992* (2013.01); *H03H 9/25* (2013.01); *H03H 9/6483* (2013.01)

(58) Field of Classification Search
CPC ............. H03H 9/1452; H03H 9/02685; H03H 9/02818; H03H 9/02834; H03H 9/02992; H03H 9/25; H03H 9/6483; H03H 9/02574; H03H 9/02637; H03H 9/14547; H03H 9/1455; H03H 9/14591; H03H 9/725

USPC .......................................... 333/133, 193–196
See application file for complete search history.

(56) References Cited

U.S. PATENT DOCUMENTS

| | | | |
|---|---|---|---|
| 5,477,098 A * | 12/1995 | Eguchi ................. | H03H 9/6406 |
| | | | 310/313 R |
| 5,867,075 A | 2/1999 | Fischerauer | |
| 8,232,852 B2 | 7/2012 | Nl et al. | |
| 2011/0109196 A1* | 5/2011 | Goto ................... | H03H 9/02228 |
| | | | 310/313 C |

FOREIGN PATENT DOCUMENTS

| | | |
|---|---|---|
| CN | 103384961 A | 11/2013 |
| WO | WO-2010116995 A1 | 10/2010 |

OTHER PUBLICATIONS

International Search Report and Written Opinion—PCT/EP2021/076147—ISA/EPO—dated Jan. 10, 2022.

* cited by examiner

*Primary Examiner* — Rakesh B Patel
*Assistant Examiner* — Jorge L Salazar, Jr.
(74) *Attorney, Agent, or Firm* — Patterson & Sheridan

(57) ABSTRACT

Certain aspects of the present disclosure provide an electroacoustic device and methods for signal processing via the electroacoustic device. One example electroacoustic device generally includes a first surface acoustic wave (SAW) resonator comprising a first apodized interdigital transducer (IDT) disposed between a first busbar and a second busbar, and a second SAW resonator comprising a second apodized IDT disposed between the second busbar and a third busbar, wherein the second busbar is at an angle with respect to at least one of the first busbar or the third busbar.

31 Claims, 11 Drawing Sheets

CASCADED SURFACE ACOUSTIC WAVE DEVICES WITH APODIZED INTERDIGITAL TRANSDUCERS

BACKGROUND

Field of the Disclosure

Certain aspects of the present disclosure relate generally to electronic components and, more particularly, to surface acoustic wave (SAW) devices.

Description of Related Art

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 100 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as the electronic devices enumerated above (e.g., particularly including portable electronic devices such as cellular phones).

Today, surface acoustic wave (SAW) or bulk acoustic wave (BAW) components may be used in wireless communication devices, such as for implementing RE filters. In SAW technology, the acoustic wave propagates laterally on a surface of a piezoelectric substrate, with the movement of the piezoelectric generated by metal interdigital transducers (IDTs) on the surface. The wavelength of the acoustic wave may be defined by the pitch (e.g., the width of the metal finger and gap) of the IDT. In BAW technology, the acoustic wave propagates vertically through a three-dimensional structure, with an electric field applied through electrodes above and below a piezoelectric material. The wavelength, in this case, is defined by the thickness of the piezoelectric material.

In one type of SAW device a surface acoustic wave is generated by an input IDT and detected by an output IDT. In another type of SAW device, the acoustic energy may be confined using reflectors on either side of the IDT. A planar resonant cavity created between two mirrors consisting of reflecting metal strips can also be used to trap the acoustic energy.

As the number of frequency bands used in wireless communications increases and as the desired frequency band of filters widen, the performance of acoustic filters increases in importance to reduce losses and increase overall performance of electronic devices. Acoustic filters with improved performance, particularly filters with reduced intermodulation distortion, are therefore sought after.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include implementation of surface acoustic wave (SAW) technology.

Certain aspects of the present disclosure provide an electroacoustic device. The electroacoustic device generally includes: a first SAW resonator comprising a first apodized interdigital transducer (IDT) disposed between a first busbar and a second busbar; and a second SAW resonator comprising a second apodized IDT disposed between the second busbar and a third busbar, wherein the second busbar is at an angle with respect to at least one of the first busbar or the third busbar.

Certain aspects of the present disclosure provide an electroacoustic device. The electroacoustic device generally includes: a first SAW resonator comprising a first IDT disposed between a first busbar and a second busbar; and a second SAW resonator comprising a second IDT disposed between the second busbar and a third busbar, wherein the second busbar is at an angle with respect to at least one of the first busbar or the third busbar, wherein the first IDT comprises a first set of fingers extending from the second busbar, and wherein lengths of the first set of fingers decrease as each of the first set of fingers gets closer to a side of the first IDT.

Certain aspects of the present disclosure provide a method for signal processing. The method generally includes receiving a signal at a first busbar, and processing the signal via a first SAW resonator and a second SAW resonator. In certain aspects, the first SAW resonator comprises a first apodized IDT disposed between the first busbar and a second busbar, and the second SAW resonator comprises a second apodized IDT disposed between the second busbar and a third busbar, wherein the second busbar is at an angle with respect to at least one of the first busbar or the third busbar. The method may also include providing the processed signal at the third busbar.

Certain aspects of the present disclosure provide a method for signal processing. The method generally includes receiving a signal at a first busbar, and processing the signal via a first SAW resonator and a second SAW resonator. In certain aspects, the first SAW resonator comprises a first IDT disposed between a first busbar and a second busbar, and the second SAW resonator comprises a second IDT disposed between the second busbar and a third busbar, wherein the second busbar is at an angle with respect to at least one of the first busbar or the third busbar, wherein the first IDT comprises a first set of fingers extending from the second busbar, and wherein lengths of the first set of fingers decrease as each of the first set of fingers gets closer to a side of the first IDT. The method may also include providing the processed signal at the third busbar.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figures 1A, 1B:
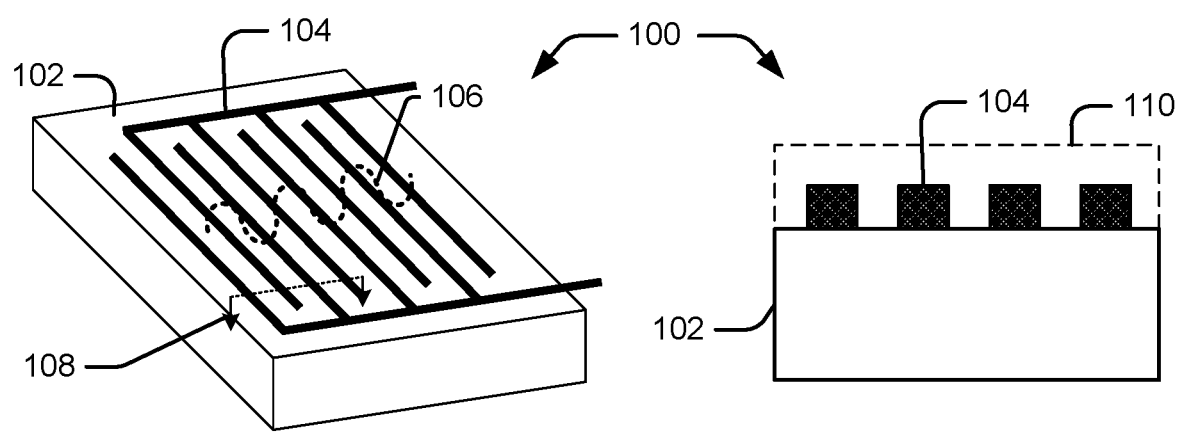
FIG. 1A is a diagram of a perspective view of an example electroacoustic device, in which certain aspects of the present disclosure may be practiced.
FIG. 1B is a diagram of a side view of the example electroacoustic device of FIG. 1A.

Certain aspects of the present disclosure generally relate to an electroacoustic device having cascaded surface acoustic wave (SAW) devices, at least two adjacent SAW devices each having an apodized interdigital transducer (IDT). The apodized IDTs facilitate suppression of transversal modes for the electroacoustic device. The IDT of each SAW device may be between two busbars, and adjacent SAW devices may share a common busbar such that the SAW devices are cascaded. In some aspects, the shared busbar may be implemented at an angle with respect to the other busbar of the adjacent SAW device, allowing the cascaded SAW devices to be implemented with reduced area consumption as compared to other implementations of cascaded SAW devices with apodized IDTs.

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Example Electroacoustic Devices

FIG. 1A is a diagram of a perspective view of an example electroacoustic device 100. The electroacoustic device 100 may be configured as or be a portion of a SAW resonator. In certain descriptions herein, the electroacoustic device 100 may be referred to as a SAW resonator. However, there may be other electroacoustic device types that may be constructed based on the principles described herein.

The electroacoustic device 100 includes an electrode structure 104, that may be referred to as an interdigital transducer (IDT), on the surface of a piezoelectric material 102. The electrode structure 104 generally includes first and second comb-shaped electrode structures (conductive and generally metallic) with electrode fingers extending from two busbars towards each other arranged in an interlocking manner in between the two busbars (e.g., arranged in an interdigitated manner). An electrical signal excited in the electrode structure 104 (e.g., applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars).

FIG. 1B is a diagram of a side view of the electroacoustic device 100 of FIG. 1A along a cross-section 108 shown in FIG. 1A. The electroacoustic device 100 is illustrated by a simplified layer stack including the piezoelectric material 102 with the electrode structure 104 disposed on the piezoelectric material 102. The electrode structure 104 is electrically conductive and generally formed from metallic materials. The electrode structure 104 may alternatively be formed from materials that are electrically conductive, but non-metallic (e.g., graphene). The piezoelectric material 102 may be formed from a variety of materials such as quartz, lithium tantalate ($LiTaO_3$), lithium niobite ($LiNbO_3$), doped variants of these, other piezoelectric materials, or other crystals. It should be appreciated that more complicated layer stacks including layers of various materials may be possible within the stack. For example, optionally, a temperature compensation layer 110 denoted by the dashed lines may be disposed above the electrode structure 104. The piezoelectric material 102 may be extended with multiple interconnected electrode structures disposed thereon to form a multi-resonator filter or to provide multiple filters. While not illustrated, when provided as an integrated circuit component, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip chip or other techniques) may also be included.

Figure 2A:
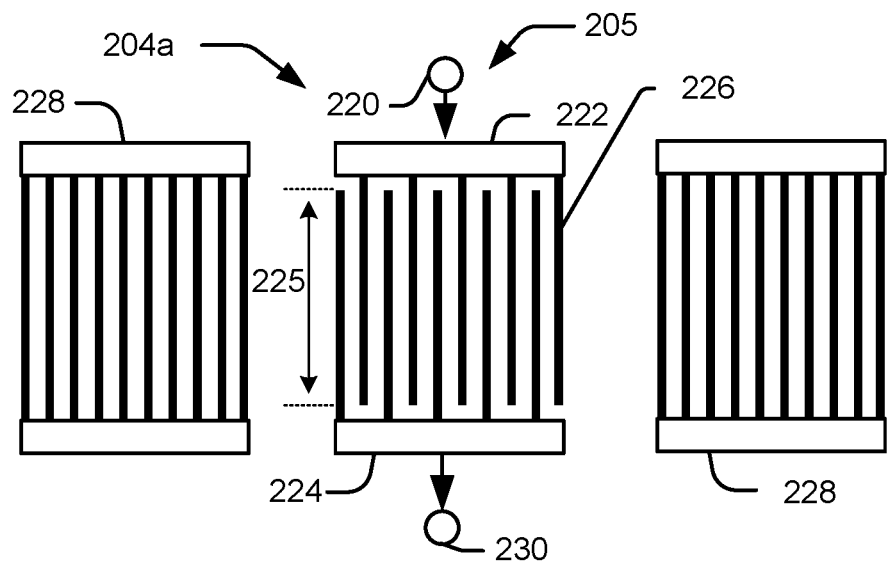
FIG. 2A is a top view of an example electrode structure of an electroacoustic device, in which certain aspects of the present disclosure may be practiced.

FIG. 2A is a top view of an example electrode structure 204a of an electroacoustic device. The electrode structure 204a has an IDT 205 that includes a first busbar 222 (e.g., first conductive segment or rail) electrically connected to a first terminal 220 and a second busbar 224 (e.g., second conductive segment or rail) spaced from the first busbar 222 and connected to a second terminal 230. A plurality of conductive fingers 226 are connected to either the first busbar 222 or the second busbar 224 in an interdigitated manner. Fingers 226 connected to the first busbar 222 extend towards the second busbar 224 but do not connect to the second busbar 224 so that there is a small gap between the ends of these fingers 226 and the second busbar 224. Likewise, fingers 226 connected to the second busbar 224 extend towards the first busbar 222 but do not connect to the first busbar 222 so that there is a small gap between the ends of these fingers 226 and the first busbar 222. Similarly, small gaps may also be formed between fingers 226 and any structure extending from the first busbar 222 or the second busbar 224 (e.g., stub fingers).

Between the busbars, there is an overlap region including a central region where a portion of one finger overlaps with a portion of an adjacent finger as illustrated by the central region 225. This central region 225 including the overlap may be referred to as the aperture, track, or active region where electric fields are produced between the fingers 226 to cause an acoustic wave to propagate in this region of the piezoelectric material 102. The periodicity of the fingers 226 is referred to as the pitch of the IDT. The pitch may be indicated in various ways. For example, in certain aspects, the pitch may correspond to a magnitude of a distance between fingers in the central region 225. This distance may be defined, for example, as the distance between center points of each of the fingers (and may be generally measured between a right (or left) edge of one finger and the right (or left) edge of an adjacent finger when the fingers have uniform width). In certain aspects, an average of distances between adjacent fingers may be used for the pitch. The frequency at which the piezoelectric material vibrates is a main resonance frequency of the electrode structure 204a. This frequency is determined at least in part by the pitch of the IDT 205 and other properties of the electroacoustic device 100.

The IDT 205 is arranged between two reflectors 228 which reflect the acoustic wave back towards the IDT 205 for the conversion of the acoustic wave into an electrical signal via the IDT 205 in the configuration shown and to prevent losses (e.g., confine and prevent escaping acoustic waves). Each reflector 228 has two busbars and a grating structure of conductive fingers that each connect to both busbars. The pitch of the reflector may be similar to or the same as the pitch of the IDT 205 to reflect acoustic waves in the resonant frequency range. But many configurations are possible.

When converted back to an electrical signal, the converted electrical signal may be provided as an output, such as to one of the first terminal 220 or the second terminal 230, while the other terminal may function as an input.

A variety of electrode structures are possible. FIG. 2A may generally illustrate a one-port configuration. Other configurations (e.g., two-port configurations) are also possible. For example, the electrode structure 204a may have an input IDT 205 where each terminal 220 and 230 functions as an input. In this event, an adjacent output IDT (not illustrated) that is positioned between the reflectors 228 and adjacent to the input IDT 205 may be provided to convert the acoustic wave propagating in the piezoelectric material 102 to an electrical signal to be provided at output terminals of the output IDT.

Figure 2B:
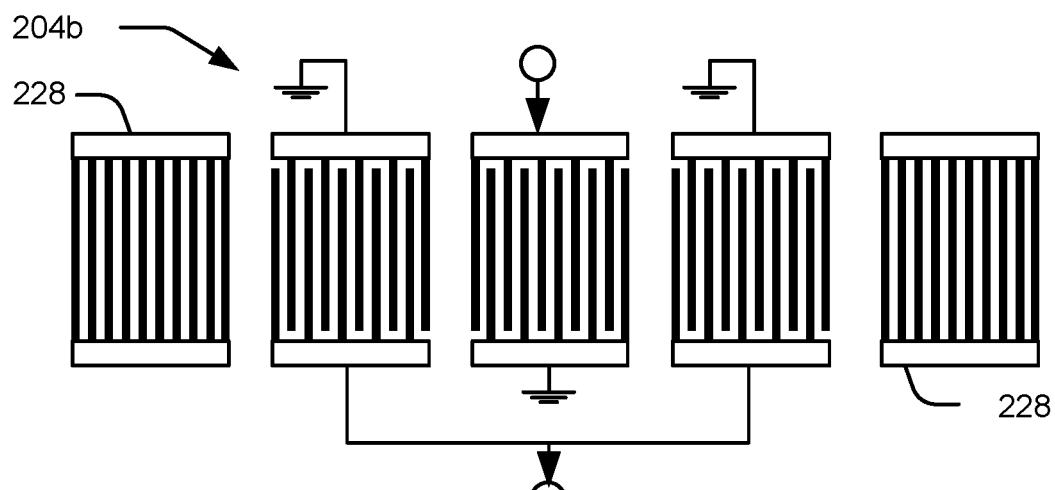
FIG. 2B is a top view of another example electrode structure of an electroacoustic device, in which certain aspects of the present disclosure may be practiced.

FIG. 2B is a top view of another example electrode structure 204b of an electroacoustic device. In this case, a dual-mode SAW (DMS) electrode structure 204b is illustrated, the DMS structure being a structure that may induce multiple resonances. The electrode structure 204b includes multiple IDTs arranged between reflectors 228 and connected as illustrated. The electrode structure 204b is provided to illustrate the variety of electrode structures that principles described herein may be applied to including the electrode structures 204a and 204b of FIGS. 2A and 2B.

It should be appreciated that while a certain number of fingers 226 are illustrated, the number of actual fingers and length(s) and width(s) of the fingers 226 and busbars may be different in an actual implementation. Such parameters depend on the particular application and desired filter characteristics. In addition, a SAW filter may include multiple interconnected electrode structures each including multiple IDTs to achieve a desired passband (e.g., multiple interconnected resonators or IDTs to form a desired filter transfer function).

Electroacoustic devices such as SAW resonators are being designed to cover more frequency ranges (e.g., 500 MHz to 6 GHz), to have higher bandwidths (e.g., up to 20%), and to have improved efficiency and performance. In general, SAW resonators are subject to nonlinearities that give rise to intermodulation distortion (IMD). For example, slight conductivity through the air or dielectric between the IDT electrodes can cause arcing and can worsen the nonlinearity, power durability, and compression of the device. Cascading the acoustic track can reduce certain amounts of intermodulation distortion, but this technique occupies increased space to implement and leads to larger SAW devices.

Notably, the relative permittivity ($\sigma_r$) of the piezoelectric substrate influences the intermodulation (nonlinearity) characteristic of a SAW filter. Nonlinear Mason equivalent circuit models have been used to simulate the effects that substrate permittivity can have on the nonlinearity of SAW filters. Furthermore, the relative permittivity of the material separating the electrodes that form IDTs on a SAW device likewise influences the nonlinearity behavior of the device. By adjusting the relative permittivity of certain dielectric structures in a SAW device, intermodulation distortion of the device can be reduced.

Figure 3A:
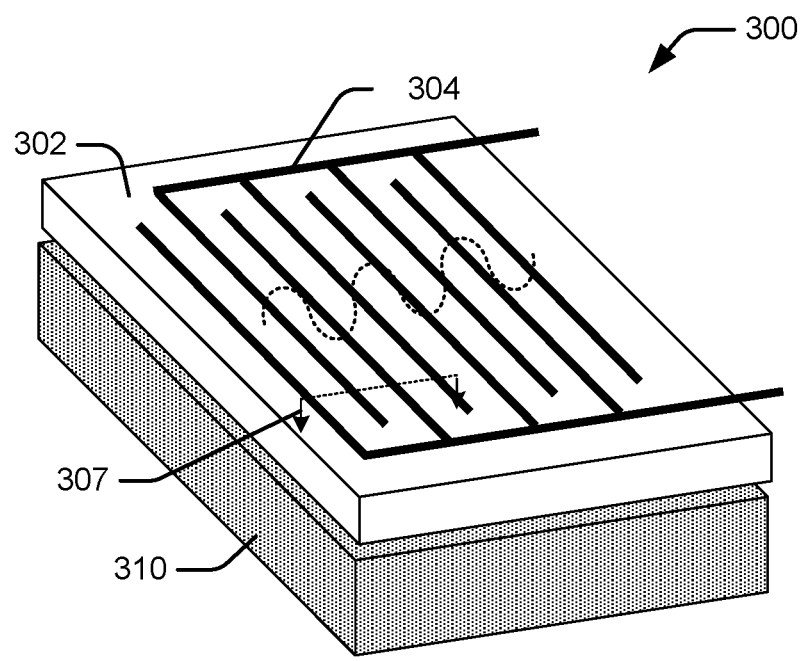
FIG. 3A is a diagram of a perspective view of an example electroacoustic device, in which certain aspects of the present disclosure may be practiced.

FIG. 3A is a diagram of a perspective view of another example of an electroacoustic device 300. The electroacoustic device 300 (e.g., that may be configured as or be a part of a SAW resonator) is similar to the electroacoustic device 100 of FIG. 1A but has a different layer stack. In particular, the electroacoustic device 300 includes a thin piezoelectric material 302 that is provided on a substrate 310 (e.g., silicon). The electroacoustic device 300 may be referred to as a thin-film SAW resonator (TF-SAW) in some cases. Based on the type of piezoelectric material 302 used (e.g., typically having higher coupling factors relative to the electroacoustic device 100 of FIG. 1) and a controlled thickness of the piezoelectric material 302, the particular acoustic wave modes excited may be slightly different than those in the electroacoustic device 100 of FIG. 1A. Based on the design (thicknesses of the layers, and selection of materials, etc.), the electroacoustic device 300 may have a higher quality factor (Q) as compared to the electroacoustic device 100 of FIG. 1A. In general, the substrate 310 may be substantially thicker than the piezoelectric material 302 (e.g., potentially on the order of 50 to 100 times thicker as one example, or more). The substrate 310 may include other layers (or other layers may be included between the substrate 310 and the piezoelectric material 302).

Figure 3B:
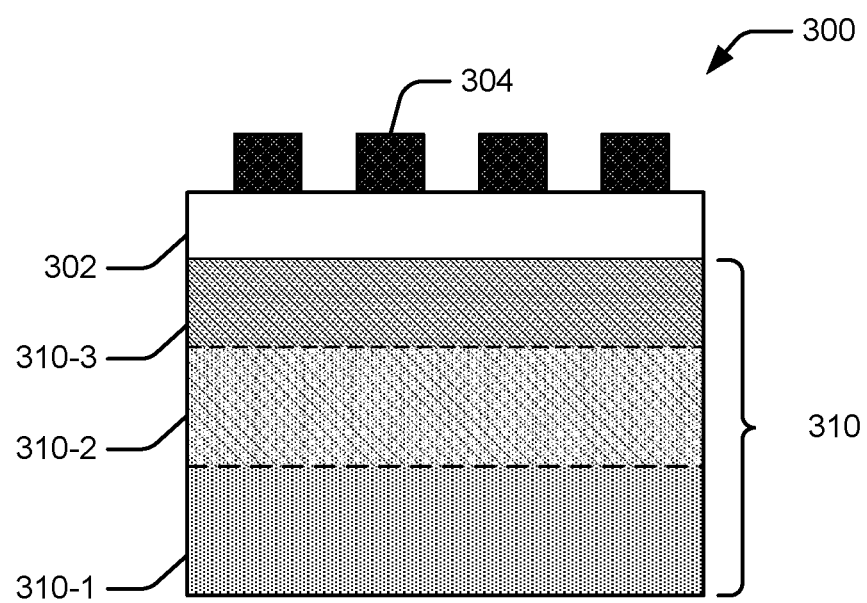
FIG. 3B is a diagram of a side view of an example electroacoustic device, in which certain aspects of the present disclosure may be practiced.

FIG. 3B is a diagram of a side view of the electroacoustic device 300 of FIG. 3A showing an exemplary layer stack (along a cross-section 307). In the example shown in FIG. 3B, the substrate 310 may include sublayers such as a substrate sublayer 310-1 (e.g., of silicon) that may have a higher resistance (e.g., relative to the other layers—high resistivity layer). The substrate 310 may further include a trap rich layer 310-2 (e.g., poly-silicon). The substrate 310 may further include a compensation layer 310-3 (e.g., silicon dioxide ($SiO_2$) or another dielectric material) that may provide temperature compensation and other properties. These sublayers may be considered part of the substrate 310 or their own separate layers. A relatively thin piezoelectric material 302 is provided on the substrate 310 with a particular thickness for providing a particular acoustic wave mode (e.g., as compared to the electroacoustic device 100 of FIG. 1A where the thickness of the piezoelectric material 102 may not be a significant design parameter beyond a certain thickness and may be generally thicker as compared to the piezoelectric material 302 of the electroacoustic device 300 of FIGS. 3A and 3B). The electrode structure 304 is positioned above the piezoelectric material 302. In addition, in some aspects, there may be one or more layers (not shown) possible above the electrode structure 304 (e.g., such as a thin passivation layer).

Based on the type of piezoelectric material, the thickness, and the overall layer stack, the coupling to the electrode structure 304 and acoustic velocities within the piezoelectric material in different regions of the electrode structure 304 may differ between different types of electroacoustic devices, such as between the electroacoustic device 100 of FIG. 1A and the electroacoustic device 300 of FIGS. 3A and 3B.

Example Resonator with Cascaded Apodized Interdigital Transducers (IDTs)

Transverse modes are a common problem of surface acoustic wave (SAW) resonators. Energy may leak in the transverse direction of the SAW track (e.g., transducer fingers of an interdigital transducer (IDT)) causing ripples and spikes within a passband of a filter implemented using the SAW resonators. How strongly these transverse modes are excited depends on various configurations of the SAW resonator, such as the crystal cut and layer configuration.

There are various techniques to suppress transverse modes, including apodization of the IDT or piston-mode design. The apodization technique may result in increased area consumption by the SAW resonator because the aperture of the resonators may be increased. In a piston-mode design, a region with a different acoustic velocity is created at the end of the SAW fingers in order to confine the transverse modes in a constructive manner within the SAW track. Using a piston-mode design to suppress transverse modes may result in additional processes.

SAW tracks may be cascaded to meet power and nonlinearity specifications. In various filter implementations, for example, resonators may be cascaded to be able to handle high-power signals. If linear apodization is used across a SAW track having cascaded SAW resonators, the size of the track may be doubled in some cases. Other apodization methods (cosine shape, etc.) are slightly smaller than linear apodization methods, but still result in considerably increased size of the resonators.

Certain aspects of the present disclosure are directed to cascaded SAW resonators implemented with apodized IDTs while reducing the area consumption of the SAW resonators as compared to other implementations of apodized IDTs. To effectively suppress the transverse modes using apodization, the length of fingers across the SAW tracks may be changed, as described in more detail herein. Certain aspects implement apodization of IDTs for cascaded SAW resonators by tilting a connecting busbar (i.e., a common busbar) between two SAW resonators.

The apodization technique described herein allows for properties of the cascaded resonators such as size and static capacitance to remain largely unchanged while suppressing transverse modes. Moreover, the size of the electroacoustic device including the cascaded SAW resonators may be independent of the apodization ratio. An apodization ratio generally refers to the ratio of a length of the shortest finger of an apodized IDT to an aperture of the apodized IDT. For example, 30% apodization ratio indicates that the shortest finger of the IDT is 30% the size of the aperture of the IDT. The SAW resonators of the electroacoustic device of the present disclosure may be implemented with various suitable apodization ratios, such as 30% or 100%. In other words, for certain SAW resonator designs, a lower apodization ratio may be used since less transverse modes may manifest in the design.

Certain aspects also provide advantages regarding busbar modes. Depending on the aperture size and crystal configuration, resonant modes also appear between the busbars of the SAW tracks, which can be suppressed by shaping the busbar across the track. Certain aspects of the present disclosure also suppress resonant modes due to the middle busbar of cascaded SAW devices being tilted such that, contrary to other implementations of apodized SAW resonators, the SAW resonators of the present disclosure have little to no inactive areas within the IDTs.

Figure 4A:
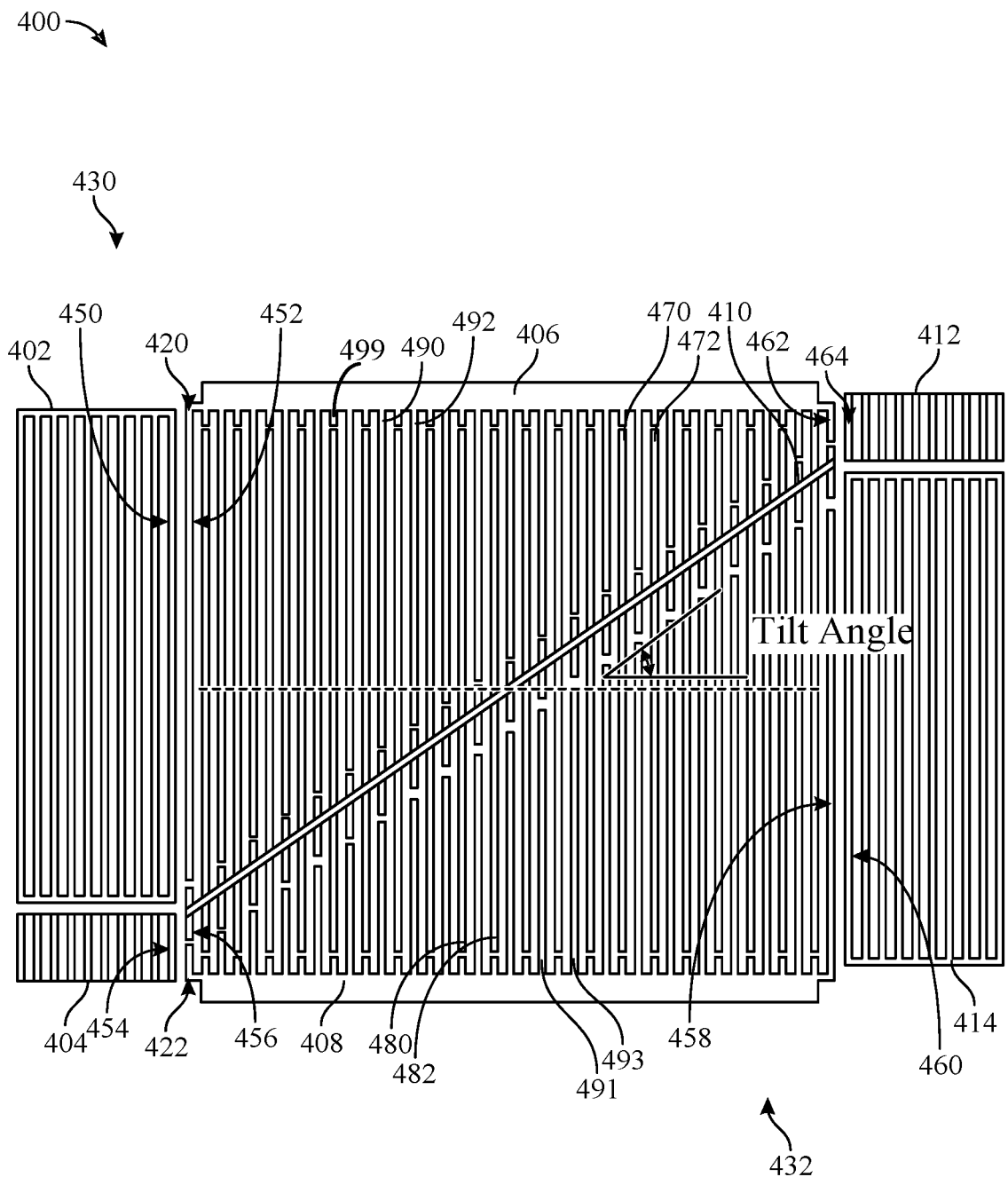
FIG. 4A illustrates an electroacoustic device having cascaded surface acoustic wave (SAW) resonators implemented with IDTs, in accordance with certain aspects of the present disclosure.

FIG. 4A illustrates an electroacoustic device 400 having cascaded SAW resonators implemented with IDTs, in accordance with certain aspects of the present disclosure. As illustrated, the electroacoustic device 400 includes a SAW resonator 430 that may be implemented using a reflector 402, an IDT 420, and a reflector 412. The electroacoustic device 400 may also include a SAW resonator 432 that may be implemented using a reflector 404, an IDT 422, and a reflector 414.

The SAW resonators 430, 432 may be cascaded. For example, the IDT 420 may have a busbar 406 and a busbar 410, and the IDT 422 may comprise the busbar 410 and a busbar 408. In other words, the IDT 420 may include fingers extending from the busbar 406 interdigitated with fingers extending from the busbar 410, and the IDT 422 may include fingers extending from the busbar 408 interdigitated with fingers extending from the busbar 410. Thus, the SAW resonators 430, 432 share a common busbar (namely, busbar 410) in this cascaded resonator configuration.

In certain aspects, the busbar 410 may be at an angle (e.g., labeled "tilt angle" in FIG. 4A) with respect to the busbar 406 or busbar 408. The tilt angle of the busbar 410 may be greater than 0 degrees and less than or equal to 45 degrees, depending on the apodization ratio to be implemented for the IDTs 420, 422.

Implementing the busbar 410 with a tilt angle facilitates the IDTs 420, 422 to be implemented as apodized IDTs. For example, the IDT 420 includes fingers (e.g., fingers 470, 472) extending from the busbar 410 where the lengths of the fingers decrease as each of the fingers gets closer to a side 462 of the IDT 420. As illustrated, the IDT 420 also includes fingers (e.g., fingers 490, 492) extending from the busbar 406. The fingers extending from the busbar 406 are interdigitated with the fingers extending from the busbar 410, as illustrated. The lengths of the fingers extending from busbar 406 decrease as each of the fingers gets closer to the side 462 of the IDT 420.

Similarly, the IDT 422 includes fingers (e.g., fingers 480, 482) extending from the busbar 410, where lengths of the fingers increase as each of the set of fingers gets closer to a side 458 of the IDT 422. The IDT 422 also includes fingers (e.g., fingers 491, 493) extending from the busbar 408. The fingers extending from the busbar 408 may be interdigitated with the fingers of the IDT 422 extending from the busbar 410. The lengths of the fingers extending from busbar 408 increase as each of the fingers gets closer to the side 458 of the IDT 422.

As illustrated, the reflector 402 is disposed adjacent to a side 452 of the IDT 420, opposite from the side 462, and the reflector 412 is disposed adjacent to the side 462 of the IDT 420. The length of the reflector 402 at side 450 may be the same as the length of the IDT 420 at side 452, and the length of the reflector 412 at side 464 may be the same as the length of the IDT 420 at side 462. The length of the reflector 402 at side 450 may be greater than the length of the reflector 412 at side 464.

Similarly, the reflector 404 is disposed adjacent to a side 456 of the IDT 422, opposite from the side 458, and a reflector 414 is disposed adjacent to the side 458 of the IDT 422. The length of the reflector 404 at side 454 may be the same as the length of the IDT 422 at side 456, and the length of the reflector 414 at side 460 may be the same as the length of the IDT 422 at side 458. The length of the reflector 404 at side 454 may be less than the length of the reflector 414 at side 460.

Optionally, multiple stubs may be formed that protrude from each of the busbars 406, 410, 408. For example, as illustrated, stub 499 protruding from busbar 406 may be optionally formed. The multiple stubs may be formed to reduce diffraction losses. While stubs are shown in FIG. 4A, it should be appreciated that other implementations may not include stubs.

Figure 4B:
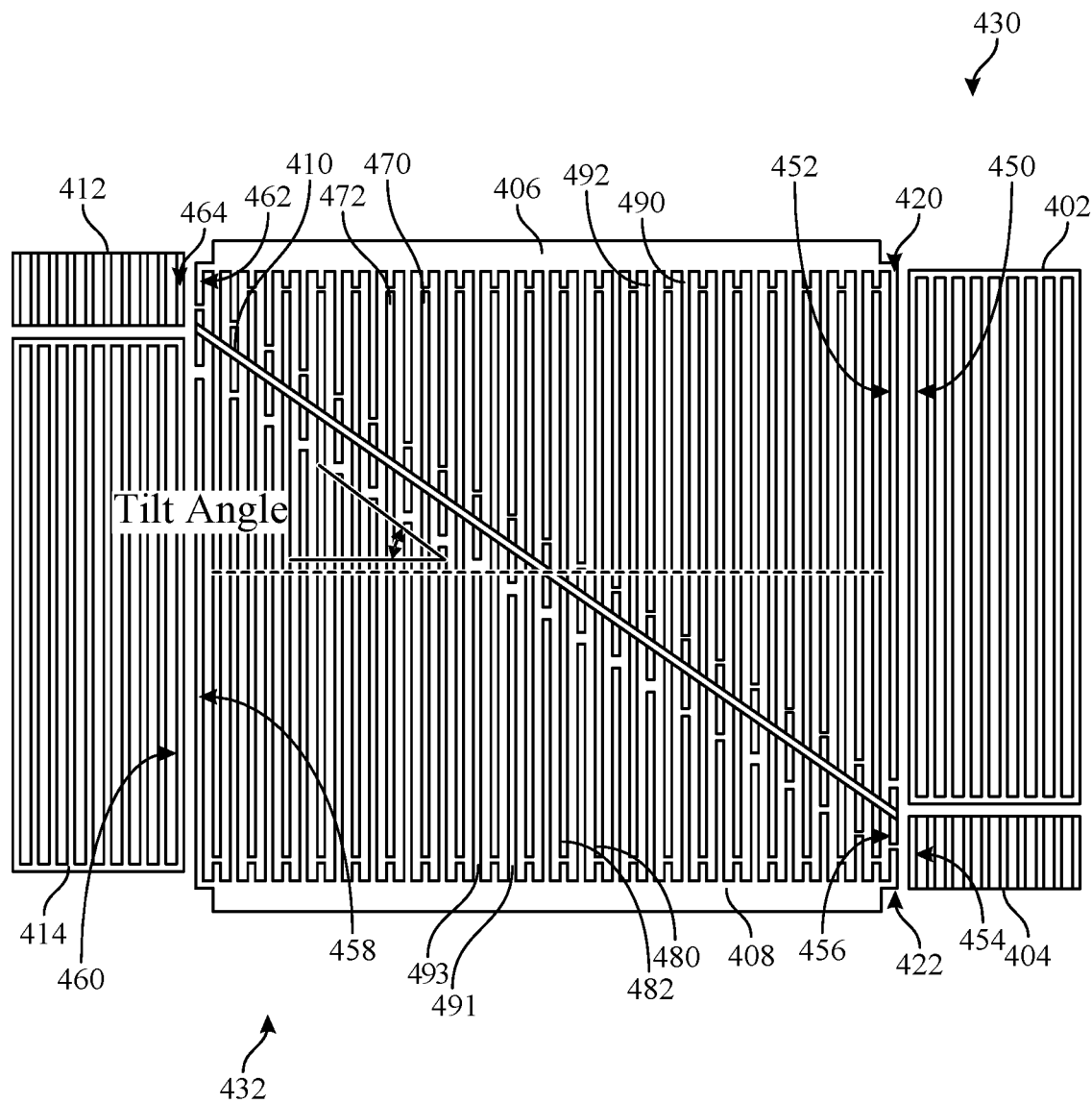
FIG. 4B illustrates the electroacoustic device of FIG. 4A implemented using an alternate orientation, in accordance with certain aspects of the present disclosure.

FIG. 4B illustrates the electroacoustic device 400 implemented using an alternate orientation, in accordance with certain aspects of the present disclosure. For example, fingers of the IDT 420 increase in length as the fingers get closer to the side 452 (right side as shown in FIG. 4B) of the IDT. In contrast, fingers of the IDT 420 of the electroacoustic device 400 of FIG. 4A decrease in length as the fingers get closer to the right side of the IDT. Similarly, in FIG. 4B, fingers of the IDT 422 decrease in length as the fingers get closer to the side 456 (right side as shown in FIG. 4B) of the IDT 422.

Figure 5:
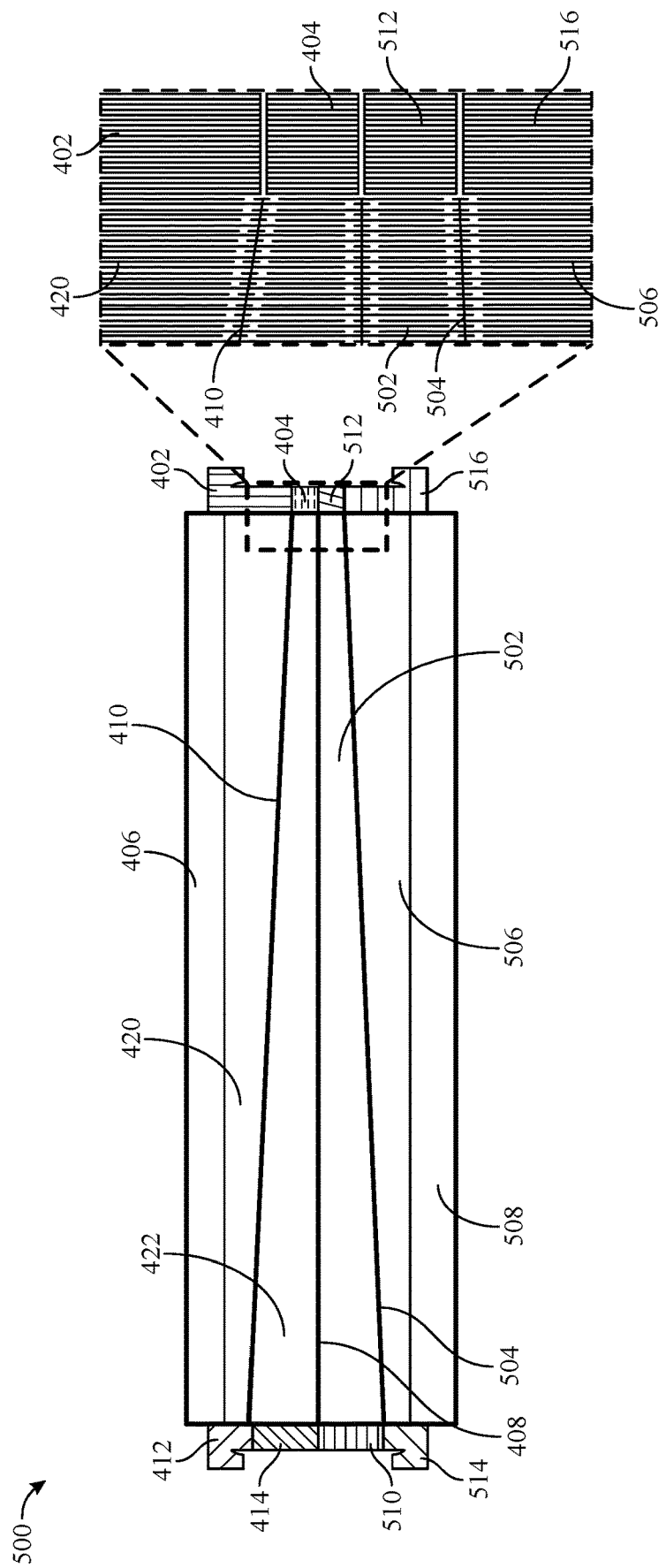
FIG. 5 illustrates an electroacoustic device having four cascaded SAW resonators, in accordance with certain aspects of the present disclosure.

FIG. 5 illustrates an electroacoustic device 500 having four cascaded SAW resonators, in accordance with certain aspects of the present disclosure. While examples of two and four cascaded SAW resonators are described herein to facilitate understanding, the aspects described herein may be implemented for any number of cascaded SAW resonators. As illustrated, the electroacoustic device 500 includes the IDT 420 between busbar 406 and busbar 410, and IDT 422 between busbar 410 and busbar 408. As described, busbar 410 may be at an angle with respect to the busbar 406 or busbar 408. As illustrated, the electroacoustic device 500 may also include an IDT 502 disposed between the busbar 408 and a busbar 504, and an IDT 506 disposed between the busbar 504 and a busbar 508. The busbar 504 may be at an angle with respect to busbar 408 or busbar 508. Reflectors 510, 512 may be disposed adjacent to opposite sides of the IDT 502, forming a SAW resonator. Reflectors 514, 516 may be disposed adjacent to opposite sides of the IDT 506, forming another SAW resonator, as illustrated. Thus, electroacoustic device 500 includes four SAW resonators cascaded in series including a first resonator having IDT 420, a second SAW resonator having IDT 422, a third SAW resonator having IDT 502, and a fourth SAW resonator having IDT 506.

Figure 6:
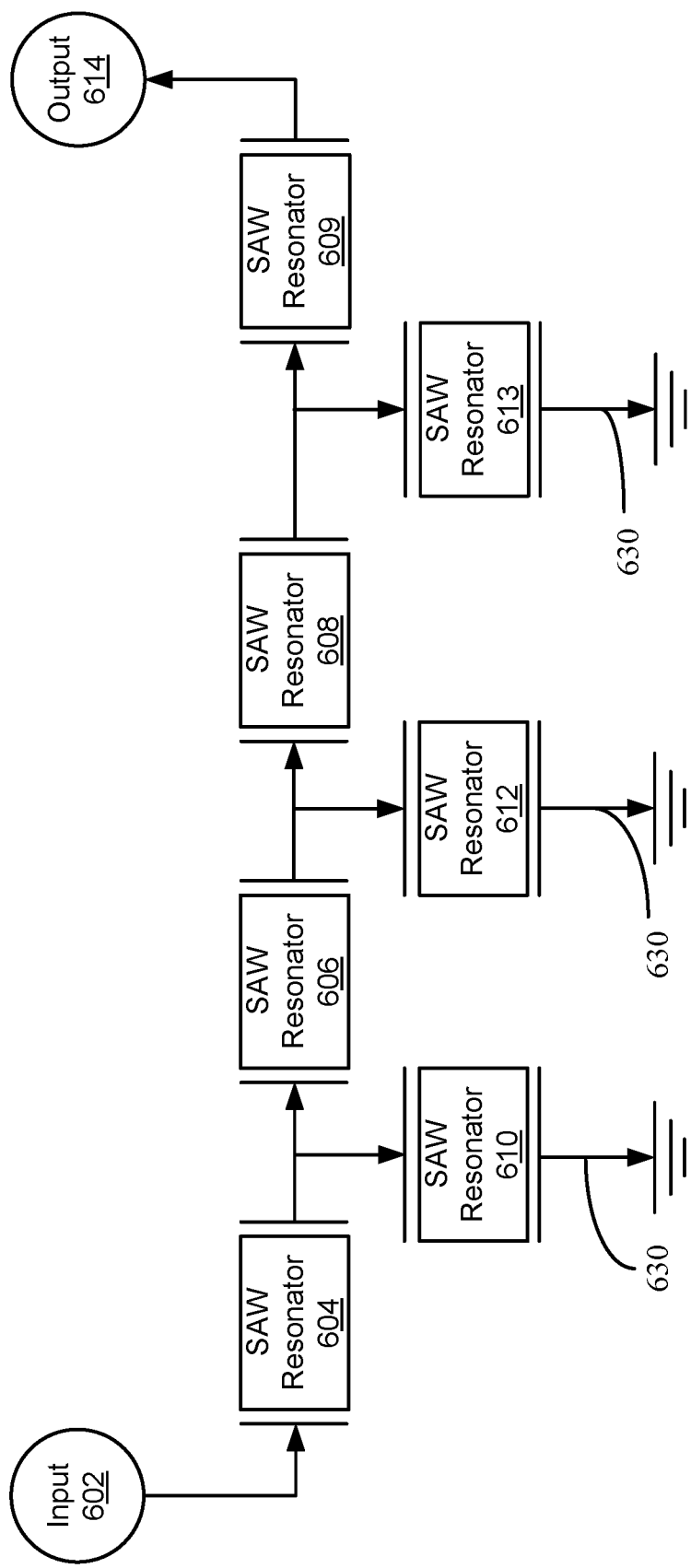
FIGS. 6 and 7 illustrate a schematic diagram and implementation of an electroacoustic filter circuit, in accordance with certain aspects of the present disclosure.

FIG. 6 illustrates a schematic diagram of an electroacoustic filter circuit 600 that may include the electroacoustic device 500 of FIG. 5, in accordance with certain aspects of the present disclosure. The filter circuit 600 provides one example of where the disclosed SAW devices may be used. The filter circuit 600 includes an input terminal 602 and an output terminal 614. Between the input terminal 602 and the output terminal 614, a ladder-type network of SAW resonators is provided. The filter circuit 600 includes a first SAW resonator 604, a second SAW resonator 606, a third SAW resonator 608, and a fourth SAW resonator 609, all electrically connected in a series path between the input terminal 602 and the output terminal 614. A fifth SAW resonator 610 (e.g., a shunt resonator) has a first terminal connected between the first SAW resonator 604 and the second SAW resonator 606 and has a second terminal connected to a reference potential node 630 (e.g., electric ground) for the filter circuit 600. A sixth SAW resonator 612 (e.g., a shunt resonator) has a first terminal connected between the second SAW resonator 606 and the third SAW resonator 608 and has a second terminal connected to the reference potential node 630. A seventh SAW resonator 613 (e.g., a shunt resonator) has a first terminal connected between the third SAW resonator 608 and the fourth SAW resonator 609 and has a second terminal connected to the reference potential node 630.

Each of SAW resonators 604, 606, 608, 609, 610, 612, 613 may be implemented as described with respect to the electroacoustic device 500 of FIG. 5. That is, each of the SAW resonators 604, 606, 608, 609, 610, 612, 613 may include multiple (e.g., four) cascaded SAW resonators as described with respect to FIG. 5. For example, the SAW resonator 604 may include IDT 420 coupled between busbars 406, 410 forming a first SAW resonator, IDT 422 coupled between busbars 410, 408 forming a second SAW resonator, IDT 502 coupled between busbars 408, 504 forming a third SAW resonator, and IDT 506 coupled between busbars 504, 508 forming a fourth SAW resonator. As described, busbars 410, and 504 may be at an angle with respect to busbars 406, 408, 508, facilitating formation of apodized IDTs as described.

In some implementations, each of the SAW resonators 604, 606, 608, 609, 610, 612, 613 may be implemented with two cascaded SAW resonators, such as a first SAW resonator formed using IDT 420 coupled between busbars 406, 410, and a second SAW resonator formed using IDT 422 coupled between busbars 410, 408. The electroacoustic filter circuit 600 may, for example, be a bandpass filter circuit having a passband with a selected frequency range (e.g., on the order between 500 MHz and 6 GHz).

Figure 7:
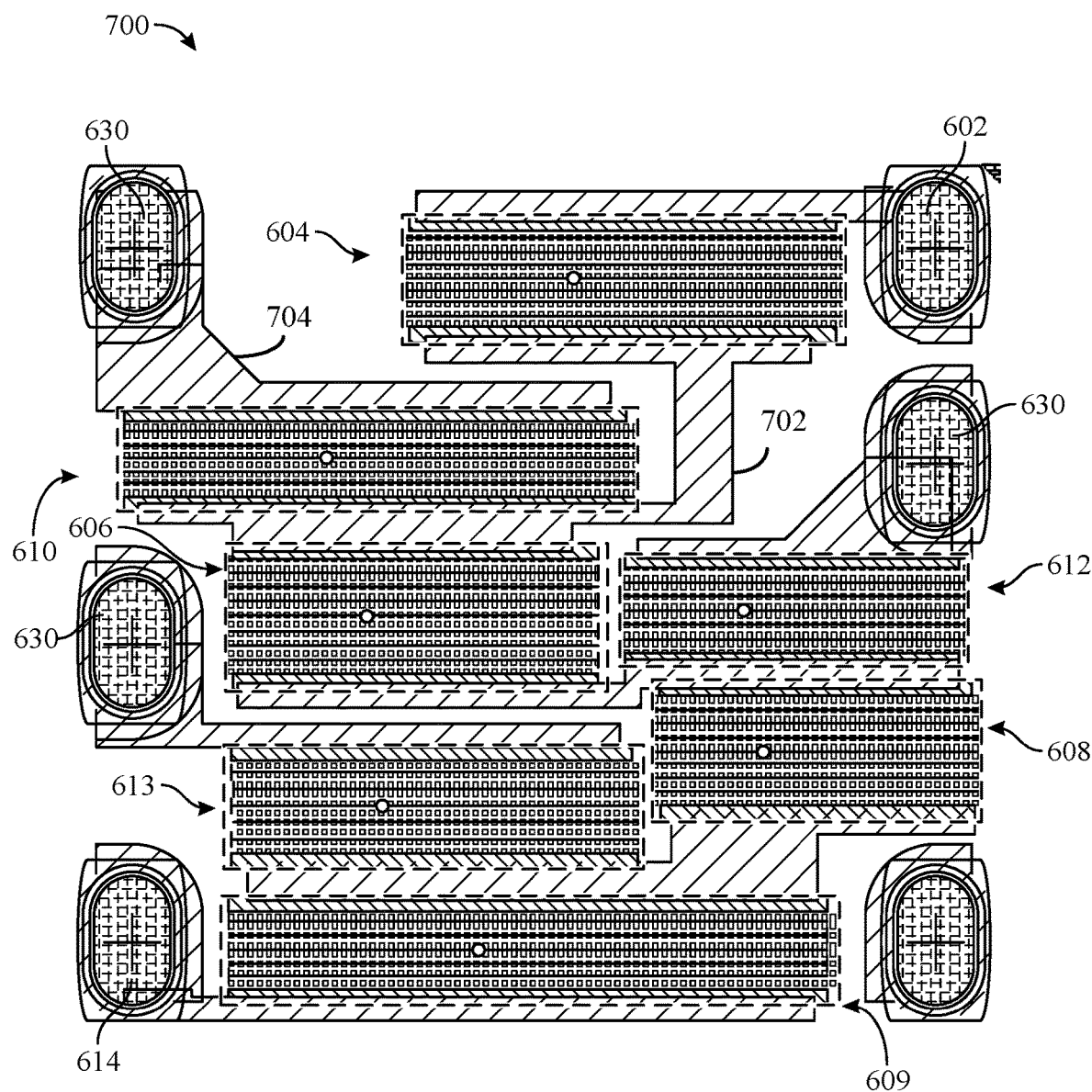

FIG. 7 is an example layout 700 of the electroacoustic filter circuit 600, in accordance with certain aspects of the present disclosure. Each of SAW resonators 604, 606, 608, 609, 610, 612, 613 may be implemented with four cascaded apodized resonators, as described with respect to FIG. 5. As illustrated, various traces may be used to couple the SAW resonators 604, 606, 608, 609, 610, 612, 613 in the configuration described with respect to FIG. 6. For example, trace 702 may be used to couple SAW resonator 604 to SAW resonators 610, 606, and trace 704 may be used to couple SAW resonator 610 to the reference potential node 630.

Figure 8:
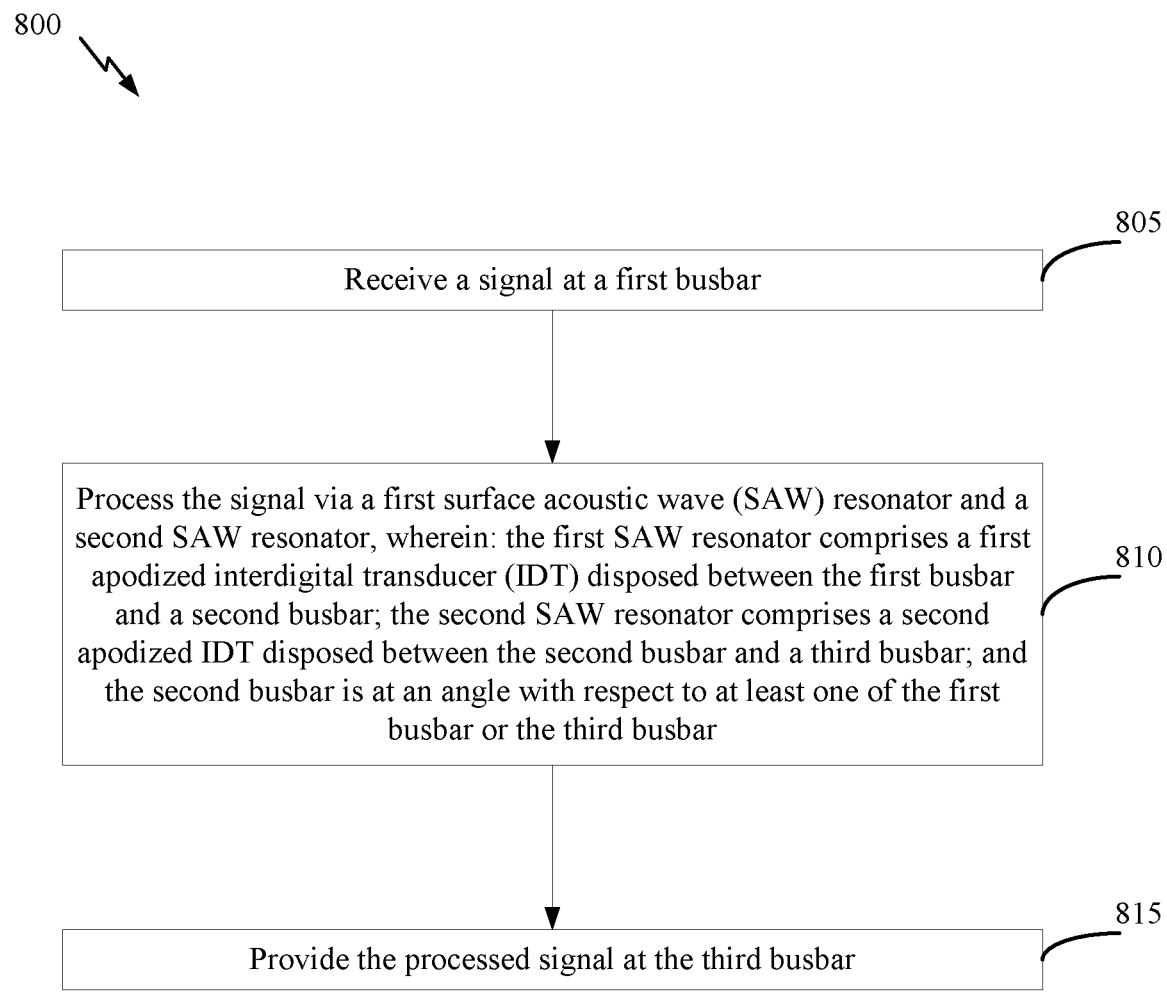
FIG. 8 is a flow diagram depicting example operations for signal processing, in accordance with certain aspects of the present disclosure.

FIG. 8 is a flow diagram depicting example operations 800 for signal processing, in accordance with certain aspects of the present disclosure. For example, the operations 800 may be performed by an electroacoustic device, such as the electroacoustic device 400 or 500.

The operations 800 may begin, at block 805, with the electroacoustic device receiving a signal at a first busbar (e.g., busbar 406), and at block 810, processing the signal via a first SAW resonator (e.g., SAW resonator 430) and a second SAW resonator (e.g., SAW resonator 432). As described in more detail herein, the first SAW resonator may include an apodized IDT implemented between the first busbar and a second busbar (e.g., busbar 410), and the second SAW resonator may include an apodized IDT implemented between the second busbar and a third busbar (e.g., busbar 406). At block 815, the electroacoustic device may provide the processed signal at the third busbar.

As described herein, the electroacoustic device may include a first SAW resonator including a first apodized IDT (e.g., IDT 420) disposed between a first busbar (e.g., busbar 406) and a second busbar (e.g., busbar 410). In other words, the first apodized IDT may include fingers disposed between the first busbar and the second busbar. The electroacoustic device may also include a second SAW resonator including a second apodized IDT (e.g., IDT 422) disposed between the second busbar and a third busbar (e.g., busbar 406). In other words, the second apodized IDT may include fingers disposed between the second busbar and the third busbar. The second busbar may be at an angle with respect to at least one of the first busbar or the third busbar.

In some aspects, the first busbar may be parallel to the third busbar. In certain aspects, the first apodized IDT and the second apodized IDT are asymmetrical with respect to a center line between the first SAW resonator and the second SAW resonator.

In some aspects, a length of a first side (e.g., side 452) of the first apodized IDT may be greater than a length of a second side (e.g., side 462) of the first apodized IDT, the first side and the second side being opposite sides of the first apodized IDT. Moreover, a length of a first side (e.g., side 456) of the second apodized IDT may be less than a length of a second side (e.g., side 458) of the second apodized IDT, the first side and the second side of the second apodized IDT being opposite sides of the second apodized IDT. In certain aspects, the second busbar may be longer than the first busbar and the third busbar, and ends of the first busbar, the second busbar, and the third busbar may be aligned (e.g., aligned within a tolerance such as twice a distance between adjacent fingers of the first or second apodized IDT) on each side of the first busbar, the second busbar and the third busbar.

In some aspects, the first apodized IDT may include a first set of fingers (e.g., fingers 470, 472) extending from the second busbar. The lengths of the first set of fingers may decrease as each of the first set of fingers gets closer to a side (e.g., side 462) of the first apodized IDT. The second apodized IDT may include a second set of fingers (e.g., fingers 480, 482) extending from the second busbar. The lengths of the second set of fingers may increase as each of the second set of fingers gets closer to a side (e.g., side 458) of the second apodized IDT.

In some aspects, the first apodized IDT may include a third set of fingers (e.g., fingers 490, 492) extending from the first busbar, the third set of fingers being interdigitated with the first set of fingers. Lengths of the third set of fingers may decrease as each of the third set of fingers gets closer to the side (e.g., side 462) of the first apodized IDT. In some aspects, the second apodized IDT may include a fourth set of fingers (e.g., fingers 490, 492) extending from the third busbar, the fourth set of fingers being interdigitated with the second set of fingers. Lengths of the fourth set of fingers may increase as each of the fourth set of fingers gets closer to the side (e.g., side 458) of the second apodized IDT.

In some aspects, the first SAW resonator may include a first reflector (e.g., reflector 402) having a side (e.g., side 450) adjacent to a first side (e.g., side 452) of the first apodized IDT, and a second reflector (e.g., reflector 412) having a side (e.g., side 464) adjacent to a second side (e.g., side 462) of the first apodized IDT, the first side and the second side being opposite sides of the first apodized IDT. A length of the side of the first reflector may be different than the length of the second side of the first apodized IDT, and a length of the side of the second reflector may be different than the length of the first side of the first apodized IDT. In some aspects, the second SAW resonator may include a third reflector (e.g., reflector 404) having a side (e.g., side 454) adjacent to a first side (e.g., side 456) of the second apodized IDT, and a fourth reflector (e.g., reflector 414) having a side (e.g., side 460) adjacent to a second side (e.g., side 458) of the second apodized IDT, the first side and the second side of the second apodized IDT being opposite sides of the second apodized IDT. A length of the side of the third reflector may be different than the length of the second side of the second apodized IDT, and a length of the side of the fourth reflector may be different than the length of the first side of the second apodized IDT. In some aspects, a length of the side of the first reflector may be greater than a length of the side of the second reflector.

In some aspects, the angle of the second busbar with respect to the at least one of the first busbar or the third busbar is greater than 0 degrees and less than or equal to 45 degrees. In certain aspects, the electroacoustic device may include a third SAW resonator having a third apodized IDT disposed between the third busbar (e.g., busbar 406) and a fourth busbar (e.g., busbar 504), and a fourth SAW resonator having a fourth apodized IDT disposed between the fourth busbar and a fifth busbar (e.g., busbar 508) such that the first SAW resonator, the second SAW resonator, the third SAW resonator, and the fourth SAW resonator are cascaded. In some aspects, the fourth busbar may be at an angle with respect to at least one of the third busbar or the fifth busbar. In some aspects, the angle of the fourth busbar with respect to the third busbar may be the same as the angle of the second busbar with respect to the third busbar.

In certain aspects, the first apodized IDT and the second apodized IDT are disposed above at least one piezoelectric layer (e.g., piezoelectric material 102 or 302). In some aspects, the at least one piezoelectric layer is disposed between a substrate and at least one of the first apodized IDT and the second apodized IDT. In some aspects, the substrate may include a substrate layer (e.g., substrate sublayer 310-1), a charge trap layer (e.g., trap rich layer 310-2), and a compensation layer (e.g., compensation layer 310-3), the charge trap layer and the compensation layer being disposed between the substrate layer and the at least one piezoelectric layer.

Figure 9:
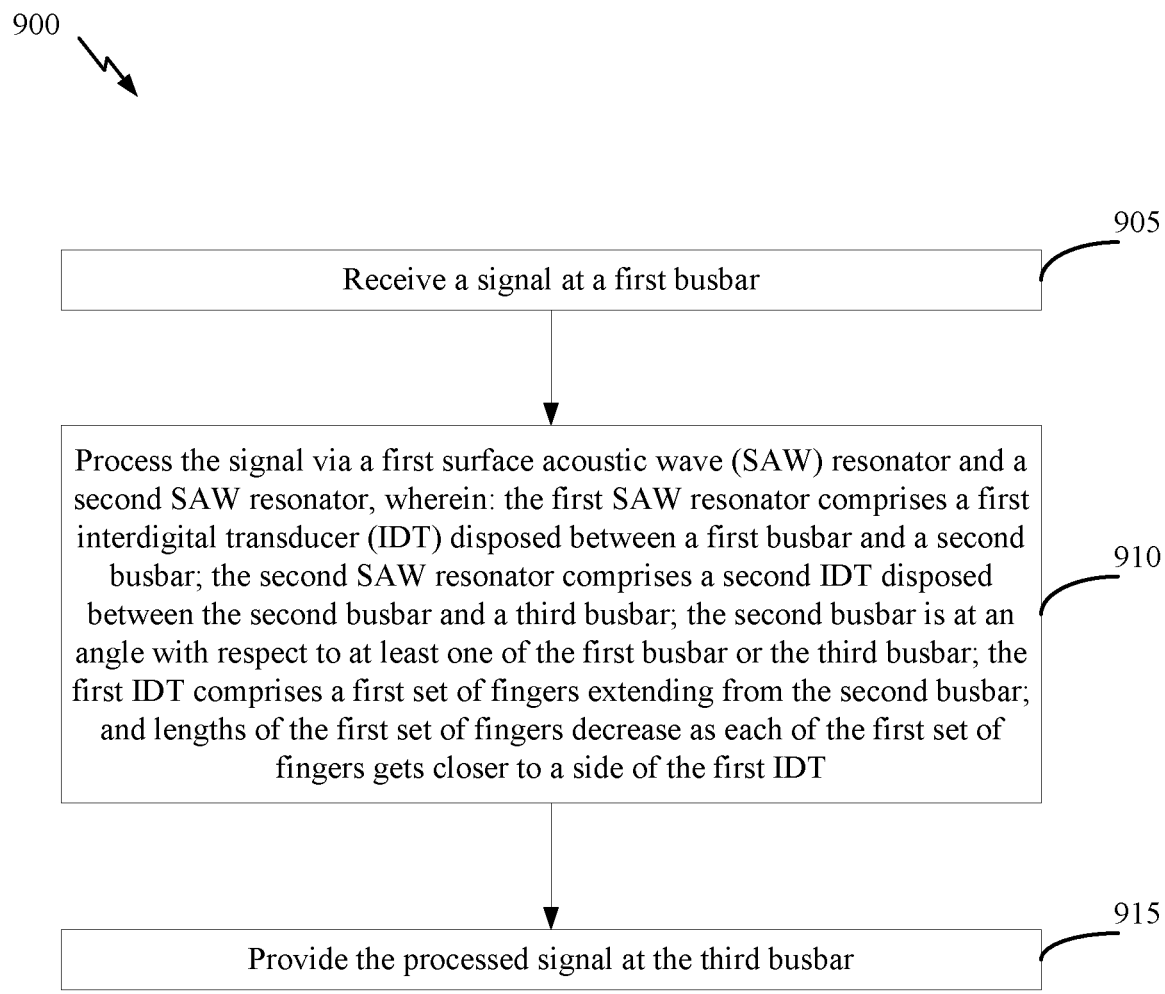
FIG. 9 is another flow diagram depicting example operations for signal processing, in accordance with certain aspects of the present disclosure.

FIG. 9 is a flow diagram depicting example operations 900 for signal processing, in accordance with certain aspects of the present disclosure. For example, the operations 900 may be performed by an electroacoustic device, such as the electroacoustic device 400 or 500.

The operations 900 begin, at block 905, with the electroacoustic device receiving a signal at a first busbar (e.g., busbar 406), and at block 910, processing the signal via a first SAW resonator (e.g., SAW resonator 430) and a second SAW resonator (e.g., SAW resonator 432). The first SAW resonator may include a first IDT (e.g., IDT 420) disposed between the first busbar (e.g., busbar 406) and a second busbar (e.g., busbar 410). The second SAW resonator may include a second IDT (e.g., IDT 422) disposed between the second busbar and a third busbar (e.g., busbar 408). The second busbar may be at an angle with respect to at least one of the first busbar or the third busbar. The first IDT may include a first set of fingers (e.g., fingers 470, 472) extending from the second busbar, where lengths of the first set of fingers decrease as each of the first set of fingers gets closer to a side (e.g., side 452) of the first IDT. At block 915, the electroacoustic device provides the processed signal at the third busbar.

Figure 10:
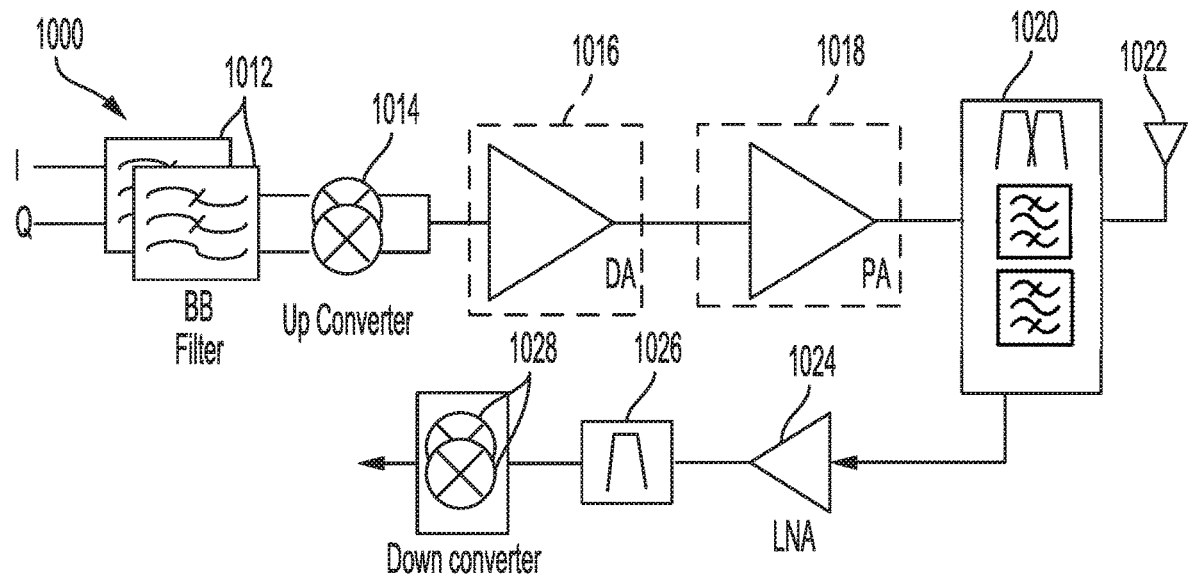
FIG. 10 is a functional block diagram of at least a portion of an example simplified wireless transceiver circuit in which an electroacoustic filter circuit may be employed.

FIG. 10 is a functional block diagram of at least a portion of an example of a simplified wireless transceiver circuit 1000 in which the filter circuit 600 of FIG. 6 may be employed. The transceiver circuit 1000 is configured to receive signals/information for transmission (shown as in-phase (I) and quadrature (Q) values) which is provided to one or more baseband (BB) filters 1012. The filtered output is provided to one or more mixers 1014 for upconversion to radio frequency (RF) signals. The output from the one or more mixers 1014 may be provided to a driver amplifier (DA) 1016 whose output may be provided to a power amplifier (PA) 1018 to produce an amplified signal for transmission. The amplified signal is output to the antenna 1022 through one or more filters 1020 (e.g., duplexers if used as a frequency division duplex transceiver or other filters). The one or more filters 1020 may include the filter circuit 600 of FIG. 6.

The antenna 1022 may be used for both wirelessly transmitting and receiving data. The transceiver circuit 1000 includes a receive path through the one or more filters 1020 to be provided to a low noise amplifier (LNA) 1024 and a further filter 1026 and then downconverted from the receive frequency to a baseband frequency through one or more mixer circuits 1028 before the signal is further processed (e.g., provided to an analog-to-digital converter (ADC) and then demodulated or otherwise processed in the digital domain). There may be separate filters for the receive circuit (e.g., may have a separate antenna or have separate receive filters) that may be implemented using the filter circuit 600 of FIG. 6.

Figure 11:
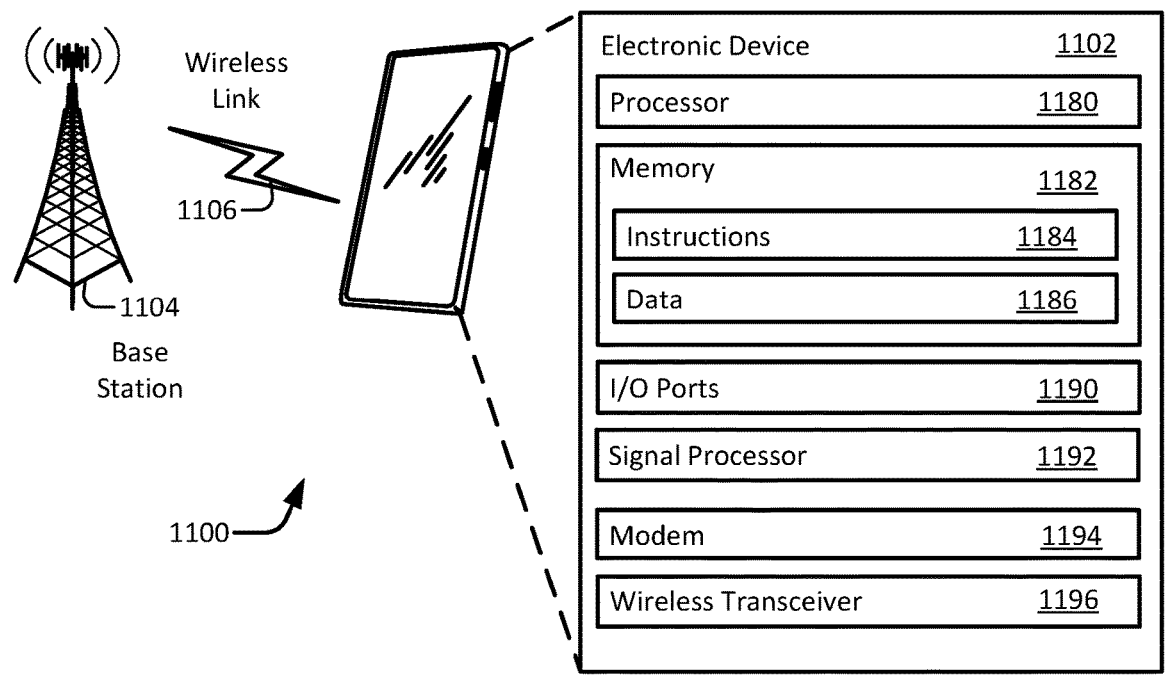
FIG. 11 is a diagram of an environment that includes an electronic device having a wireless transceiver such as the transceiver circuit of FIG. 10.

FIG. 11 is a diagram of an environment 1100 that includes an electronic device 1102, in which aspects of the present disclosure may be practiced. In the environment 1100, the electronic device 1102 communicates with a base station 1104 through a wireless link 1106. As shown, the electronic device 1102 is depicted as a smartphone. However, the electronic device 1102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1104 communicates with the electronic device 1102 via the wireless link 1106, which may be implemented as any suitable type of wireless link. Although depicted as a base station tower of a cellular radio network, the base station 1104 may represent or be implemented as another device, such as a satellite, terrestrial broadcast tower, access point, peer-to-peer device, mesh network node, fiber optic line, another electronic device generally as described above, and so forth. Hence, the electronic device 1102 may communicate with the base station 1104 or another device via a wired connection, a wireless connection, or a combination thereof. The wireless link 1106 can include a downlink of data or control information communicated from the base station 1104 to the electronic device 1102 and an uplink of other data or control information communicated from the electronic device 1102 to the base station 1104. The wireless link 1106 may be implemented using any suitable communication protocol or standard, such as 3rd Generation Partnership Project Long-Term Evolution (3GPP LTE), 3GPP NR 5G, IEEE 802.11, IEEE 802.16, Bluetooth™, and so forth.

The electronic device 1102 includes a processor 1180 and a memory 1182. The memory 1182 may be or form a portion of a computer-readable storage medium. The processor 1180 may include any type of processor, such as an application processor or a multi-core processor, that is configured to execute processor-executable instructions (e.g., code) stored by the memory 1182. The memory 1182 may include any suitable type of data storage media, such as volatile memory (e.g., random access memory (RAM)), non-volatile memory (e.g., flash memory), optical media, magnetic media (e.g., disk or tape), and so forth. In the context of this disclosure, the memory 1182 is implemented to store instructions 1184, data 1186, and other information of the electronic device 1102, and thus when configured as or part of a computer-readable storage medium, the memory 1182 does not include transitory propagating signals or carrier waves.

The electronic device 1102 may also include input/output ports 1190. The I/O ports 1190 enable data exchanges or interaction with other devices, networks, or users or between components of the device.

The electronic device 1102 may further include a signal processor (SP) 1192 (e.g., such as a digital signal processor (DSP)). The signal processor 1192 may function similar to the processor and may be capable of executing instructions and/or processing information in conjunction with the memory 1182.

For communication purposes, the electronic device 1102 also includes a modem 1194, a wireless transceiver 1196, and an antenna (not shown). The wireless transceiver 1196 provides connectivity to respective networks and other electronic devices connected therewith using radio-frequency (RF) wireless signals and may include the transceiver circuit 1000 of FIG. 10. The wireless transceiver 1196 may facilitate communication over any suitable type of wireless network, such as a wireless local area network (WLAN), a peer-to-peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

The various operations of methods described above may be performed by any suitable means capable of performing the corresponding functions. The means may include various hardware and/or software component(s) and/or module(s), including, but not limited to a circuit, an application-specific integrated circuit (ASIC), or processor.

By way of example, an element, or any portion of an element, or any combination of elements described herein may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoCs), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuit.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An electroacoustic device, comprising:
a first surface acoustic wave (SAW) resonator comprising a first apodized interdigital transducer (IDT) disposed between a first busbar and a second busbar; and
a second SAW resonator comprising a second apodized IDT disposed between the second busbar and a third busbar, wherein the second busbar is at an angle with respect to at least one of the first busbar or the third busbar, wherein the first busbar is parallel to the third busbar.

2. The electroacoustic device of claim 1, wherein:
a length of a first side of the first apodized IDT is greater than a length of a second side of the first apodized IDT, the first side and the second side being opposite sides of the first apodized IDT; and
a length of a first side of the second apodized IDT is less than a length of a second side of the second apodized IDT, the first side and the second side of the second apodized IDT being opposite sides of the second apodized IDT.

3. The electroacoustic device of claim 1, wherein the second busbar is longer than the first busbar and the third busbar, and wherein ends of the first busbar, the second busbar, and the third busbar are aligned on each side of the first busbar, the second busbar and the third busbar.

4. The electroacoustic device of claim 1, wherein:
the first apodized IDT comprises a first set of fingers extending from the second busbar;
lengths of the first set of fingers decrease as each of the first set of fingers gets closer to a side of the first apodized IDT;
the second apodized IDT comprises a second set of fingers extending from the second busbar; and
lengths of the second set of fingers increase as each of the second set of fingers gets closer to a side of the second apodized IDT.

5. The electroacoustic device of claim 4, wherein:
the first apodized IDT comprises a third set of fingers extending from the first busbar, the third set of fingers being interdigitated with the first set of fingers;
lengths of the third set of fingers decrease as each of the third set of fingers gets closer to the side of the first apodized IDT;
the second apodized IDT comprises a fourth set of fingers extending from the third busbar, the fourth set of fingers being interdigitated with the second set of fingers; and
lengths of the fourth set of fingers increase as each of the fourth set of fingers gets closer to the side of the second apodized IDT.

6. The electroacoustic device of claim 1, wherein the first SAW resonator further comprises:
a first reflector having a side adjacent to a first side of the first apodized IDT; and
a second reflector having a side adjacent to a second side of the first apodized IDT, the first side and the second side being opposite sides of the first apodized IDT.

7. The electroacoustic device of claim 6, wherein:
a length of the side of the first reflector is different than the length of the second side of the first apodized IDT; and
a length of the side of the second reflector is different than the length of the first side of the first apodized IDT.

8. The electroacoustic device of claim 6, wherein the second SAW resonator further comprises:
a third reflector having a side adjacent to a first side of the second apodized IDT; and
a fourth reflector having a side adjacent to a second side of the second apodized IDT, the first side and the second side of the second apodized IDT being opposite sides of the second apodized IDT.

9. The electroacoustic device of claim 8, wherein:
a length of the side of the third reflector is different than the length of the second side of the second apodized IDT; and
a length of the side of the fourth reflector is different than the length of the first side of the second apodized IDT.

10. The electroacoustic device of claim 6, wherein a length of the side of the first reflector is different than a length of the side of the second reflector.

11. The electroacoustic device of claim 1, wherein the angle of the second busbar with respect to the at least one of the first busbar or the third busbar is greater than 0 degrees and less than or equal to 45 degrees.

12. The electroacoustic device of claim 1, further comprising:
a third SAW resonator comprising a third apodized IDT disposed between the third busbar and a fourth busbar; and
a fourth SAW resonator comprising a fourth apodized IDT disposed between the fourth busbar and a fifth busbar such that the first SAW resonator, the second SAW resonator, the third SAW resonator, and the fourth SAW resonator are cascaded, wherein the fourth busbar is at an angle with respect to at least one of the third busbar or the fifth busbar.

13. The electroacoustic device of claim 12, wherein the angle of the fourth busbar with respect to the third busbar is the same as the angle of the second busbar with respect to the third busbar.

14. The electroacoustic device of claim 1, wherein the first apodized IDT and the second apodized IDT are disposed above at least one piezoelectric layer.

15. The electroacoustic device of claim 14, wherein the at least one piezoelectric layer is disposed between a substrate and at least one of the first apodized IDT and the second apodized IDT.

16. The electroacoustic device of claim 15, wherein the substrate comprises:
a substrate layer;
a charge trap layer; and
a compensation layer, the charge trap layer and the compensation layer being disposed between the substrate layer and the at least one piezoelectric layer.

17. The electroacoustic device of claim 1, wherein the first apodized IDT and the second apodized IDT are asymmetrical with respect to a center line between the first SAW resonator and the second SAW resonator.

18. An electroacoustic device, comprising:
a first surface acoustic wave (SAW) resonator comprising a first interdigital transducer (IDT) disposed between a first busbar and a second busbar; and a second SAW resonator comprising a second IDT disposed between the second busbar and a third busbar, wherein the second busbar is at an angle with respect to at least one of the first busbar or the third busbar, wherein the first IDT comprises a first set of fingers extending from the second busbar, and wherein lengths of the first set of fingers decrease as each of the first set of fingers gets closer to a side of the first IDT, wherein the second IDT comprises a second set of fingers extending from the second busbar, wherein lengths of the second set of fingers increase as each of the second set of fingers gets closer to a side of the second IDT, the side of the second IDT being on a same side of the electroacoustic device as the side of the first IDT, wherein the first IDT comprises a third set of fingers extending from the first busbar, the third set of fingers being interdigitated with the first set of fingers, wherein lengths of the third set of fingers decrease as each of the third set of fingers gets closer to the side of the first IDT, wherein the second IDT comprises a fourth set of fingers extending from the third busbar, the fourth set of fingers being interdigitated with the second set of fingers, and wherein lengths of the fourth set of fingers increase as each of the fourth set of fingers gets closer to the side of the second IDT.

19. The electroacoustic device of claim 18, wherein the second busbar is longer than the first busbar and the third busbar, and wherein ends of the first busbar, the second busbar, and the third busbar are aligned on each side of the first busbar, the second busbar, and the third busbar.

20. The electroacoustic device of claim 18, wherein the first SAW resonator further comprises:
a first reflector having a side adjacent to the side of the first IDT; and
a second reflector having a side adjacent to another side of the first IDT, the side and the other side being opposite sides of the first IDT.

21. The electroacoustic device of claim 20, wherein:
a length of the side of the first reflector is different than the length of the other side of the first IDT; and
a length of the side of the second reflector is different than the length of the side of the first IDT.

22. The electroacoustic device of claim 20, wherein the second SAW resonator further comprises:
a third reflector having a side adjacent to a first side of the second IDT; and
a fourth reflector having a side adjacent to a second side of the second IDT, the first side and the second side of the second IDT being opposite sides of the second IDT.

23. The electroacoustic device of claim 22, wherein:
a length of the side of the third reflector is different than the length of the second side of the second IDT; and
a length of the side of the fourth reflector is different than the length of the first side of the second IDT.

24. The electroacoustic device of claim 20, wherein a length of the side of the first reflector is different than a length of the side of the second reflector.

25. The electroacoustic device of claim 18, wherein the angle of the second busbar with respect to the at least one of the first busbar or the third busbar is greater than 0 degrees and less than or equal to 45 degrees.

26. An electroacoustic device, comprising:
a first surface acoustic wave (SAW) resonator comprising a first apodized interdigital transducer (IDT) disposed between a first busbar and a second busbar, the first SAW resonator further comprising a first reflector having a side adjacent to a first side of the first apodized IDT and a second reflector having a side adjacent to a second side of the first apodized IDT, the first side and the second side being opposite sides of the first apodized IDT; and
a second SAW resonator comprising a second apodized IDT disposed between the second busbar and a third busbar, wherein the second busbar is at an angle with respect to at least one of the first busbar or the third busbar.

27. The electroacoustic device of claim 26, wherein:
a length of the side of the first reflector is different than the length of the second side of the first apodized IDT; and
a length of the side of the second reflector is different than the length of the first side of the first apodized IDT.

28. The electroacoustic device of claim 26, wherein the second SAW resonator further comprises:
a third reflector having a side adjacent to a first side of the second apodized IDT; and
a fourth reflector having a side adjacent to a second side of the second apodized IDT, the first side and the second side of the second apodized IDT being opposite sides of the second apodized IDT, wherein a length of the side of the third reflector is different than the length of the second side of the second apodized IDT, and wherein a length of the side of the fourth reflector is different than the length of the first side of the second apodized IDT.

29. The electroacoustic device of claim 26, wherein a length of the side of the first reflector is different than a length of the side of the second reflector.

30. A method for signal processing, comprising:
receiving a signal at a first busbar;
processing the signal via a first surface acoustic wave (SAW) resonator and a second SAW resonator, wherein:
the first SAW resonator comprises a first apodized interdigital transducer (IDT) disposed between the first busbar and a second busbar;
the second SAW resonator comprises a second apodized IDT disposed between the second busbar and a third busbar; and
the second busbar is at an angle with respect to at least one of the first busbar or the third busbar, wherein the second busbar is longer than the first busbar and the third busbar, and wherein ends of the first busbar, the second busbar, and the third busbar are aligned on each side of the first busbar, the second busbar and the third busbar; and
providing the processed signal at the third busbar.

31. An electroacoustic device, comprising:
a first surface acoustic wave (SAW) resonator comprising a first apodized interdigital transducer (IDT) disposed between a first busbar and a second busbar; and
a second SAW resonator comprising a second apodized IDT disposed between the second busbar and a third busbar, wherein the second busbar is at an angle with respect to at least one of the first busbar or the third busbar, wherein the first apodized IDT and the second apodized IDT are disposed above at least one piezoelectric layer, wherein the at least one piezoelectric layer is disposed between a substrate and at least one of the first apodized IDT and the second apodized IDT, wherein the substrate comprises:

a substrate layer;
a charge trap layer; and
a compensation layer, the charge trap layer and the compensation layer being disposed between the substrate layer and the at least one piezoelectric layer.

* * * * *